(12) United States Patent
Eriksson et al.

(10) Patent No.: US 6,259,298 B1
(45) Date of Patent: *Jul. 10, 2001

(54) METHOD AND AN ARRANGEMENT FOR ADAPTING FROM A DC POINT OF VIEW A FIRST CIRCUIT TO AT LEAST ONE SECOND CIRCUIT

(75) Inventors: Hans Eriksson, Järfälla; Elisabeth Larsson, Bromma, both of (SE)

(73) Assignee: Telefonaktiebolaget LM Ericsson (publ), Stockholm (SE)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/961,208

(22) Filed: Oct. 30, 1997

(30) Foreign Application Priority Data

Nov. 8, 1996 (SE) .................................................... 9604102

(51) Int. Cl.[7] ........................................................ H03L 5/00
(52) U.S. Cl. ........................... 327/333; 327/322; 327/538; 326/30; 326/86; 330/157
(58) Field of Search ................................. 326/30, 21, 27, 326/82, 86, 90; 333/32; 327/333, 315, 318, 322, 319, 98, 307, 530, 538, 68, 56; 330/157, 159, 177, 181, 191, 198

(56) References Cited

U.S. PATENT DOCUMENTS

| | | | |
|---|---|---|---|
| 5,321,324 | 6/1994 | Hardee et al. | 326/62 |
| 5,486,778 | 1/1996 | Lou | 326/71 |
| 5,541,531 | 7/1996 | Kultgen | 326/62 |
| 5,604,450 | * 2/1997 | Borkar et al. | 326/82 |
| 5,731,711 | * 3/1998 | Gabara | 326/30 |

OTHER PUBLICATIONS

N.I. Lavrantiev, "Simple DC Modulator" Electronics World + Wireless World, vol. 100, p. 68 (Jan. 1994).

* cited by examiner

Primary Examiner—Timothy P. Callahan
Assistant Examiner—Minh Nguyen
(74) Attorney, Agent, or Firm—Burns, Doane, Swecker & Mathis, L.L.P.

(57) ABSTRACT

In a method and an arrangement for adapting, from a DC point of view, the signal input of a first circuit, lying at a first DC voltage, to the signal output of at least one second circuit, lying at a second DC voltage, the signal input terminal is connected to the respective signal output terminal of the respective second circuit via a respective first resistance, whereby first DC currents will be allowed to flow through the respective first resistance. The signal input is adapted to be virtually short-circuited to a source for the first DC voltage, which is of a predetermined value, separate from zero. The first circuit is adapted to internally generate a DC cancellation current and bring it to flow in the signal input. The signal input is to be connected to ground via a selectable, second resistance, whereby a second DC current will flow through the second resistance. This second resistance is to be selected in such a manner that the sum of the DC cancellation current, the first DC currents, and the second DC current, equals zero.

8 Claims, 1 Drawing Sheet

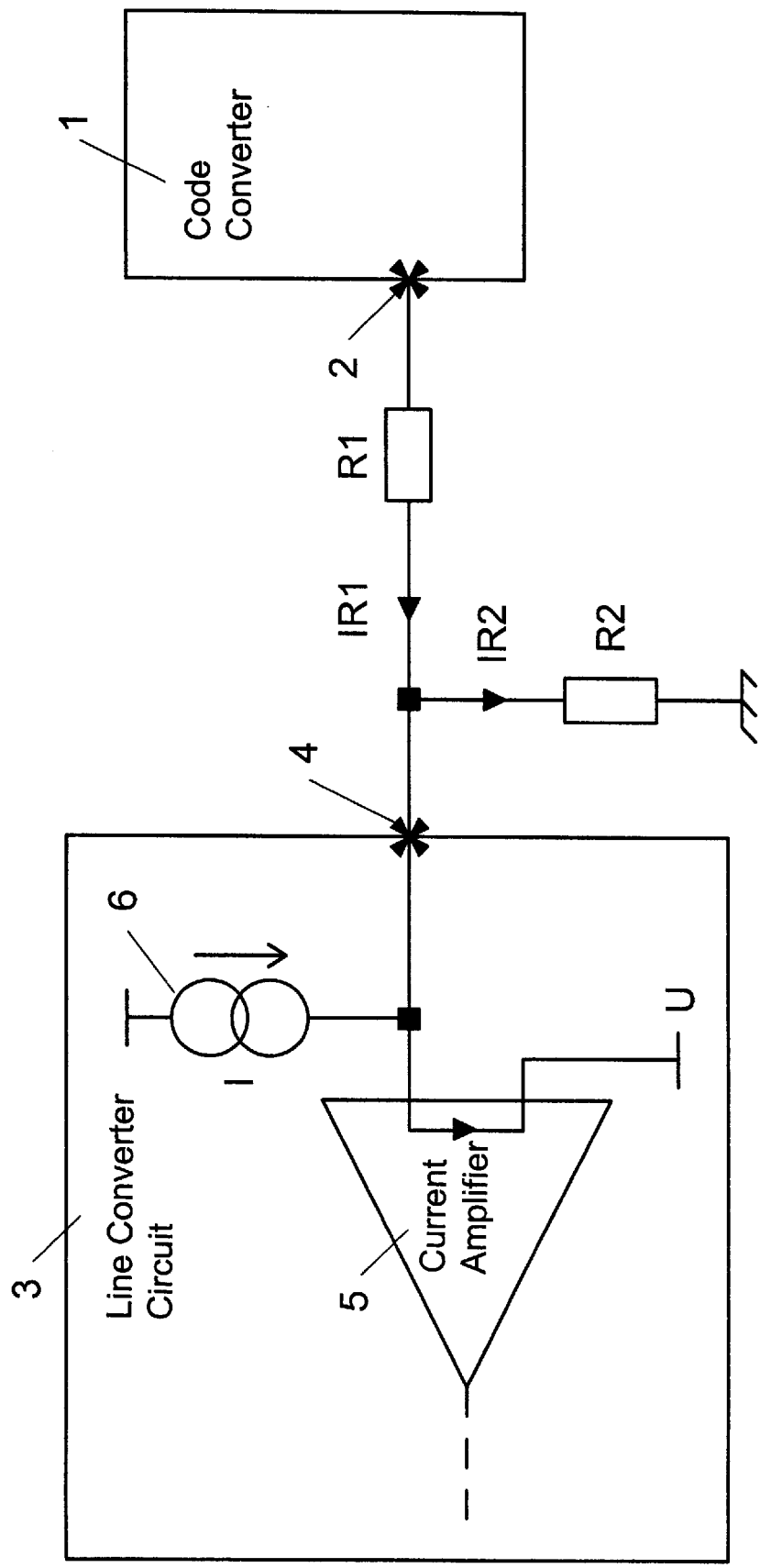

METHOD AND AN ARRANGEMENT FOR ADAPTING FROM A DC POINT OF VIEW A FIRST CIRCUIT TO AT LEAST ONE SECOND CIRCUIT

TECHNICAL FIELD

The invention relates, generally, to an arrangement for adapting, from a DC point of view, a first circuit to at least one second circuit and, more specifically, to an arrangement for adapting, from a DC point of view, the signal input terminal of a first circuit, lying at a first DC reference level, to the signal output terminal of at least one second circuit, lying at a second DC reference level.

BACKGROUND

On e.g. line interface boards provided with line interface circuits and code converters, the signal input terminals of the line interface circuits as well as the signal output terminals of the code converters were earlier related to ground which enabled a direct connection between the signal input terminal of a line interface circuit and the signal output terminal of a code converter. However, modern code converters have a reference voltage for their signal output terminal somewhere between ground and +5 V, most often around 2.25 V, while the signal input terminal of the line interface circuits lies at ground potential. If a line interface circuit whose signal input terminal lies at ground potential, is interconnected with a code converter whose signal output terminal lies at 2.25 V, an offset current is obtained in the line current outputted by the line interface circuit. Upon a polarity reversal of the line current, this offset current will maintain its polarity. Thus, different line currents are obtained for normal and reversed polarity, respectively, of the line current. Also, the offset current can cause other problems.

One way solving this problem is to interconnect a coupling capacitor between the signal input terminal of the line interface circuit and the signal output terminal of the code converter. However, this coupling capacitor has to be large in order for the system not to become unstable.

SUMMARY

The object of the invention is to generally adapt, from a DC point of view, the signal input terminal of a first circuit, e.g. a line interface circuit, lying at a first DC reference level to the signal output terminal of at least one second circuit, e.g. a code converter, lying at a second DC reference level without the use of any coupling capacitor.

This is attained according to the invention in that a DC current is deliberately allowed to flow in the signal input terminal of the first circuit, the effect of this current being eliminated in the first circuit by generating a corresponding current of opposite polarity.

More in detail, this object is attained in accordance with the invention mainly in that the signal input terminal is adapted to be virtually short-circuited to the first DC reference voltage level which is of a predetermined value separate from zero, that the signal input terminal is connected, via a respective first resistance, to the respective signal output terminal, whereby first DC currents will be allowed to flow through the respective first resistance, that the signal input terminal is connected to ground via a selectable, second resistance, whereby a second DC current will flow through the second resistance which is to be selected in such a manner that the DC current sum formed by the first DC currents and the second DC current in the signal input terminal of the first circuit, amounts to a predetermined value, and the line interface circuit is adapted to internally generate a DC cancellation current corresponding to the DC current sum but being of opposite polarity in order to eliminate the effect of the DC current sum.

Hereby, the need of a coupling capacitor between the signal input terminal of the first circuit and the signal output terminal of the respective second circuit, will be eliminated. Thus, the first circuit will be easily adaptable to the second circuits by a suitable selection of the resistance connected to ground.

BRIEF DESCRIPTION OF THE DRAWING

The invention will be described more in detail below with reference to the appended drawing, on which the signal FIGURE shows an embodiment of an arrangement according to the invention.

DETAILED DESCRIPTION

The invention will be described in connection with a line interface circuit and a single code converter connected thereto but it is to be understood that the invention is generally applicable when it comes to adapting the signal input terminal of a first circuit, lying at a first DC reference voltage level, to the signal output terminal of at least one second circuit, lying at another DC reference voltage level.

On the drawing, 1 denotes a code converter which is adapted to transfer analog signal voltages on its signal voltage output terminal 2 to the signal current input terminal 4 of a line interface circuit 3.

The signal output terminal 2 of the code converter 1 is supposed, in the embodiment shown, to lie at a DC reference voltage level of 2.25 V, while the signal input terminal 4 of the line interface circuit 3 is supposed to lie at a DC reference voltage level which is equal to ground. As mentioned in the introductory portion, this difference in DC reference voltage level would give rise to an offset current in the line interface circuit, which offset current, in its turn, would cause line currents of different values to be outputted from the line interface circuit upon a polarity reversal.

To adapt the signal output level of the code converter 1 to the signal input level of the line interface circuit 3, according to the invention, the signal input terminal 4 of the line interface circuit 3 is adapted to be virtually short-circuited to a DC reference voltage level U which, in accordance with the invention, is of a predetermined value separate from zero.

Thus, the DC reference voltage level of the signal input terminal 4 will be at a DC voltage level U which in the embodiment shown, is supposed to be e.g. 1.25 V.

In accordance with one embodiment of the invention, the signal input terminal 4 of the line interface circuit 3 is connected to the DC voltage level U via a schematically illustrated current amplifier 5 in the line interface circuit 3. The input current of the current amplifier 5 controls its output current in a manner known per se.

In accordance with the invention, the signal output terminal 2 of the code converter 1 is connected to the signal input terminal 4 of the line interface circuit 3 via a resistance R1 whose value can differ. Since the DC voltage level on the signal output terminal 2 in the embodiment illustrated, is supposed to be higher than the DC voltage level U on the signal input terminal 4 of the line interface circuit 3, a DC current IR1 is, thus, allowed to flow through the resistance R1.

Also, in accordance with the invention, the signal input terminal 4 of the line interface circuit 3 is connected to ground via a selectable resistance R2. A DC current IR2 will, thus, flow to ground through the resistance R2.

According to the invention, the resistance R2 is to be selected in such a manner that the sum of the currents IR1 and IR2 in the signal input terminal 4 of the line interface circuit 3 amounts to a predetermined value which is independent of the value of the resistance R1. Thus, this predetermined DC current sum value is line interface circuit specific.

In the embodiment shown on the drawing, to eliminate the effect of this DC current sum of a predetermined value in the line interface circuit 3, the line interface circuit 3 is adapted to internally generate a DC cancellation current I by means of a current generator 6 in the line interface circuit 3. This DC cancellation current I corresponds to the DC current sum but is of opposite polarity.

In the embodiment shown on the drawing, the current generator 6 is connected to the signal input terminal 4 of the line interface circuit 3 and, consequently, the current I will be of the same value as the current sum in the signal input terminal 4.

In case the current generator 6, in a manner not shown, is instead connected to the output of the current amplifier 5, the current generated by the current generator would have to be equal to the current sum in the signal input terminal of the line interface circuit 3 multiplied by the gain of the current amplifier 5. However, it is to be understood that the current generator 6, of course, can be inserted in any place in the signal path from the signal input terminal 4.

Since the signal input terminal 4 is virtually short-circuited to the DC reference voltage level U, the value of the resistance R2 will only affect the DC current in the signal input terminal 4. Thus, the AC signal transmission between the signal output terminal 2 and the signal input terminal 4 will not be affected by the value of the resistance R2.

Thus, the resistance R1 may first be dimensioned for the desired AC signal transmission, whereupon the resistance R2 can be adapted for DC current balance so that the DC current in the signal input terminal 4 will be the desired current.

Thus, by means of the arrangement according to the invention, no coupling capacitor will be needed between the respective signal output terminal 2 and the signal input terminal 4. At the same time, the signal input terminal 4 of the line interface circuit 3 can easily be adapted to the DC reference voltage levels of different code converters by a simple selection of the value of the resistance R2.

It should be pointed out that it is to be understood that the signal output terminals of more than one code converter can be connected via a respective resistance to one and the same signal input terminal of the line interface circuit 3.

What is claimed is:

1. A DC offset-current cancelling arrangement for coupling an output terminal of at least one circuit having an output voltage equal to a first voltage potential to a termination point having a second voltage potential, the arrangement comprising:

a current amplifier having an input terminal, a first output terminal connected to the termination point, and a second output terminal connected to a third voltage potential, where an output current flowing out of the first output terminal is equal to an input current flow between the input terminal and the second output terminal times a current gain;

a first resistance having a first terminal connected to the input terminal of the amplifier, and a second terminal connected the output terminal of the at least one a current generator having an output terminal connected the input terminal current amplifier for producing a fixed DC cancellation current; and a second resistance having a first terminal connected to both the input terminal of the current amplifier and the first terminal of the first resistance, and a second terminal connected to a ground potential, wherein the fixed DC cancellation current, the third voltage potential, and the second resistance are such that a DC component of the input current flowing into the current amplifier is substantially zero, the input terminal of the current amplifier is substantially equal to the third voltage potential, and a DC offset-current is substantially cancelled from the output current flowing out of the first output terminal of the current amplifier.

2. The arrangement of claim 1, wherein a ratio of the first resistance and second resistance is such that a sum of a current flowing through the first resistance and a current flowing through the second resistance is substantially independent of the first resistance.

3. The arrangement of claim 1, wherein the first voltage potential is higher than the second voltage potential.

4. The arrangement of claim 1, wherein the third voltage potential is between the first and second voltage potentials.

5. The arrangement of claim 1, wherein the termination point is an input terminal of a line interface circuit.

6. The arrangement of claim 1, wherein the at least one circuit is a code converter.

7. A method for coupling an output terminal of at least one circuit having an output voltage equal to a first voltage potential to a termination point having a second voltage potential, the method comprising the steps of:

connecting a first output terminal of a current amplifier to the termination point, the current amplifier having an input terminal, and a second output terminal connected to a third voltage potential, whereby an output current flowing out of the first output terminal is equal to an input current flowing between the input terminal and the second output terminal times a current gain;

connecting a first resistance between the input terminal of the current amplifier and the output terminal of the at least one circuit;

connecting an output terminal of a current generator to the input terminal of the current amplifier, the current generator producing a fixed DC cancellation current; and selecting a second resistance for connection between the input terminal of the current amplifier and a ground potential, wherein the fixed DC cancellation current, the third voltage potential, and the second resistance are such that a DC component of the input current flowing into the current amplifier is substantially zero, the input terminal of the current amplifier is substantially equal to the third voltage potential, and a DC offset-current is substantially cancelled from the output current flowing out of the first output terminal of the current amplifier.

8. The method of claim 7, wherein the second resistance is selected such that a sum of a current flowing through the first resistance and a current flowing through the second resistance is substantially independent of the first resistance.

* * * * *